(12) United States Patent
McHugh et al.

(10) Patent No.: US 10,840,876 B2
(45) Date of Patent: Nov. 17, 2020

(54) TEMPERATURE COMPENSATED ACOUSTIC WAVE DEVICES

(71) Applicant: Resonant Inc., Santa Barbara, CA (US)

(72) Inventors: Sean McHugh, Santa Barbara, CA (US); Patrick Turner, San Bruno, CA (US); Ventsislav Yantchev, Sofia (BG); Filip Iliev, Oakland, CA (US)

(73) Assignee: Resonant Inc., Goleta, CA (US)

( * ) Notice: Subject to any disclaimer, the term of this patent is extended or adjusted under 35 U.S.C. 154(b) by 78 days.

(21) Appl. No.: 16/110,980

(22) Filed: Aug. 23, 2018

(65) Prior Publication Data

US 2019/0068159 A1 Feb. 28, 2019

Related U.S. Application Data

(60) Provisional application No. 62/549,163, filed on Aug. 23, 2017.

(51) Int. Cl.
*H03H 9/02* (2006.01)
*H03H 9/64* (2006.01)
(Continued)

(52) U.S. Cl.
CPC .......... *H03H 9/02834* (2013.01); *H03H 3/10* (2013.01); *H03H 9/02559* (2013.01);
(Continued)

(58) Field of Classification Search
CPC ........... H03H 9/02559; H03H 9/02834; H03H 9/02858; H03H 9/02881; H03H 9/02992;
(Continued)

(56) References Cited

U.S. PATENT DOCUMENTS 7,576,471 B1   8/2009 Solal
7,939,989 B2   5/2011 Solal et al.
(Continued)

OTHER PUBLICATIONS

Abbott, B., et al., "Theoretical Investigation into Spurious Modes Content in SAW Devices with a Dielectric Overcoat," Fourth International Symposium on Acoustic Wave Devices for Future Mobile Communication Systems, 2010, 11 pages.
(Continued)

*Primary Examiner* — Barbara Summons
(74) *Attorney, Agent, or Firm* — SoCal IP Law Group LLP; John E. Gunther

(57) ABSTRACT

Surface acoustic wave (SAW) resonator, SAW filters, and methods of fabricating SAW filters. A first plurality of parallel conductors extending from a first bus bar are formed on a surface of a 128-degree Y-cut lithium niobate substrate. A second plurality of parallel conductors extending from a second bus bar are formed on the surface of the substrate, the second plurality of parallel conductors interleaved with the first plurality of parallel conductors. An SiO2 layer overlays the first and second pluralities of parallel conductors. The first and second pluralities of parallel conductors are substantially copper and have a thickness $D_{CU}$ defined by $0.12P \leq D_{CU} \leq 0.24P$, where P is a center-to-center spacing of adjacent parallel conductors. The SiO2 layer has a thickness $D_{OX}$ defined by $3.1D_{CU} \leq D_{OX} \leq 4.5D_{CU}$.

18 Claims, 11 Drawing Sheets

(51) Int. Cl.
  *H03H 9/25* (2006.01)
  *H03H 3/10* (2006.01)
  *H03H 9/145* (2006.01)
  *H03H 3/04* (2006.01)

(52) U.S. Cl.
  CPC .... *H03H 9/02858* (2013.01); *H03H 9/02992* (2013.01); *H03H 9/14541* (2013.01); *H03H 9/25* (2013.01); *H03H 9/6489* (2013.01); *H03H 2003/0407* (2013.01)

(58) Field of Classification Search
  CPC ............... H03H 9/145; H03H 9/14538; H03H 9/14541; H03H 9/25; H03H 9/6489; H03H 3/08; H03H 3/10; H03H 2003/0407; H01L 41/16
  USPC .......................................................... 333/193
  See application file for complete search history.

(56) References Cited

U.S. PATENT DOCUMENTS

| | | | |
|---|---|---|---|
| 8,294,331 | B2 | 10/2012 | Abbott et al. |
| 9,065,424 | B2 | 6/2015 | Nakanishi et al. |
| 9,673,779 | B2 | 6/2017 | Ruile et al. |
| 9,712,139 | B2 | 7/2017 | Taniguchi et al. |
| 9,748,924 | B2 | 8/2017 | Komatsu et al. |
| 10,284,176 | B1 * | 5/2019 | Solal .................. G10K 11/18 |

OTHER PUBLICATIONS

M. Solal et al., "Transverse modes suppression and loss reduction for buried electrodes SAW devices," 2010 IEEE International Ultrasonics Symposium, San Diego, CA, 2010, pp. 624-628.

Solal, Marc et al. "A method to reduce losses in buried electrodes RF SAW resonators." 2011 IEEE International Ultrasonics Symposium (2011): 324-332.

K. Yamanouchi and S. Hayama, "SAW Properties of $SiO_2/128°$ Y-X $LiNbO_3$ Structure Fabricated by Magnetron Sputtering Technique," in IEEE Transactions on Sonics and Ultrasonics, vol. 31, No. 1, pp. 51-57, Jan. 1984.

Kadota, M.. "6E-5 High Performance and Miniature Surface Acoustic Wave Devices with Excellent Temperature Stability Using High Density Metal Electrodes." 2007 IEEE Ultrasonics Symposium Proceedings (2007): 496-506.

Wang, Yiliu et al. "A zero TCF band 13 SAW duplexer." 2015 IEEE International Ultrasonics Symposium (IUS) (2015): 1-4.

* cited by examiner

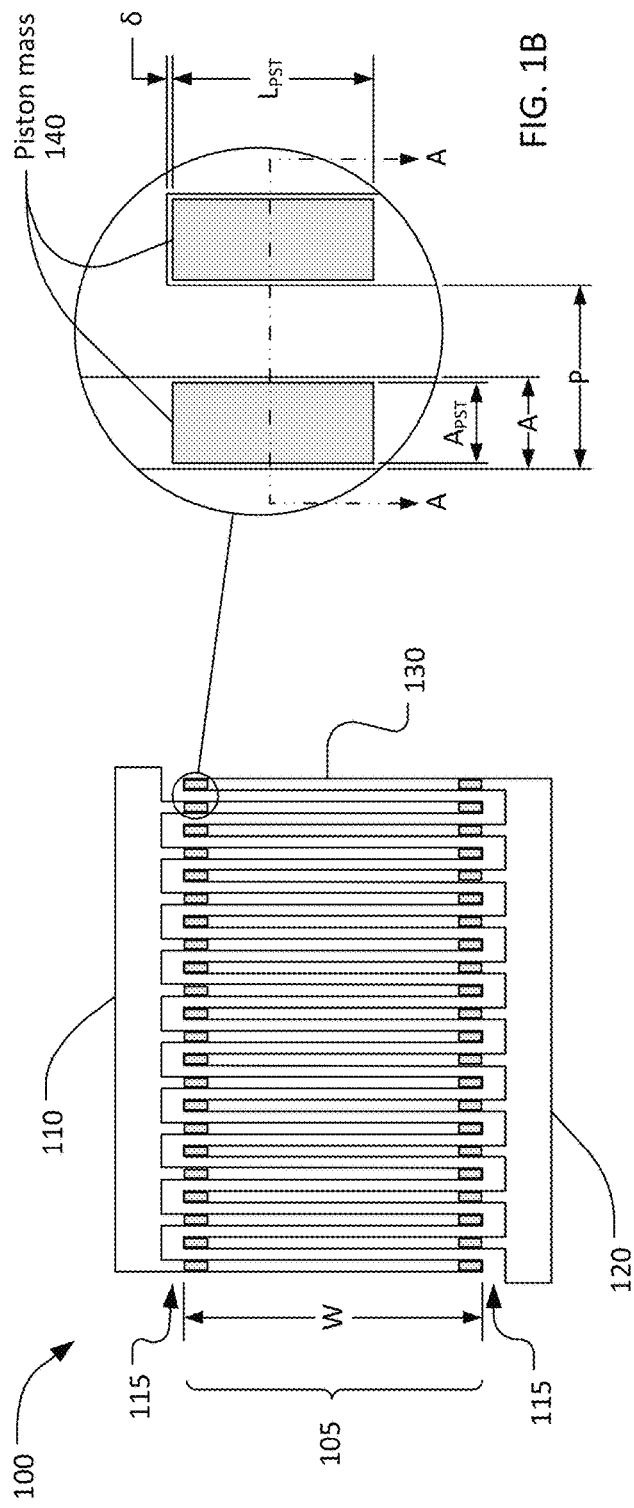
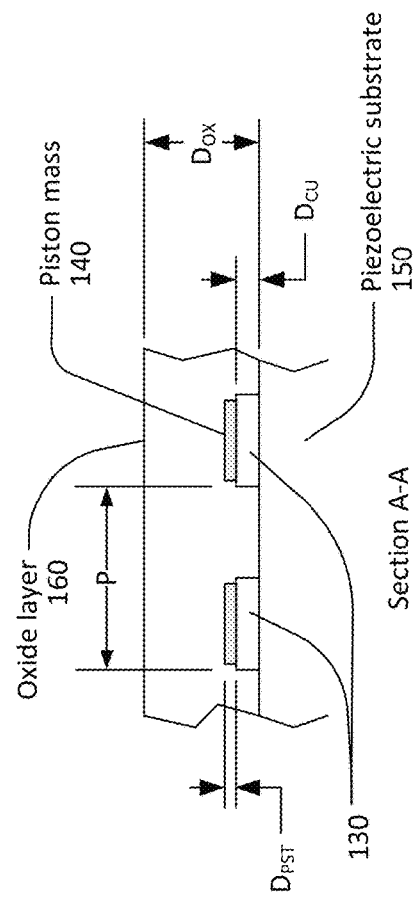
FIG. 1A
FIG. 1B
FIG. 1C

| Ref. Designator: | 610 | 620 | 630 |
|---|---|---|---|
| P(microns): | 1.1 | 1.0 | 0.9 |
| $L_{PST}/P$: | 1.7 | 1.7 | 1.7 |
| $W/P$: | 40 | 40 | 40 |
| $D_{CU}/P$: | 0.159 | 0.175 | 0.194 |
| $D_{PST}/D_{CU}$: | 0.23 | 0.23 | 0.23 |
| $D_{OX}/P$: | 0.59 | 0.65 | 0.72 |

| Ref. Designator: | 640 | 650 | 660 |
|---|---|---|---|
| P(microns): | 1.1 | 1.0 | 0.9 |
| $L_{PST}/P$: | 1.3 | 1.3 | 1.3 |
| W/P: | 40 | 40 | 40 |
| $D_{CU}/P$: | 0.159 | 0.175 | 0.194 |
| $D_{PST}/D_{CU}$: | 0.4 | 0.4 | 0.4 |
| $D_{OX}/P$: | 0.59 | 0.65 | 0.72 |

| Ref. Designator: | 670 | 680 | 690 |
|---|---|---|---|
| P(microns): | 1.1 | 1.0 | 0.9 |
| $L_{PST}/P$: | 1.3 | 1.3 | 1.3 |
| $W/P$: | 40 | 40 | 40 |
| $D_{CU}/P$: | 0.159 | 0.174 | 0.194 |
| $D_{PST}/D_{CU}$: | 0.4 | 0.4 | 0.4 |
| $D_{OX}/P$: | 0.5 | 0.55 | 0.61 |

TEMPERATURE COMPENSATED ACOUSTIC WAVE DEVICES

RELATED APPLICATION INFORMATION

This patent claims priority from provisional patent application 62/549,163, filed Aug. 23, 2017, titled TEMPERATURE COMPENSATED SAW RESONATORS, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using surface acoustic wave (SAW) resonators.

Description of the Related Art

A radio frequency (RF) filter is a two-terminal device configured to pass some frequencies and to stop other frequencies, where "pass" means transmit with relatively low insertion loss and "stop" means block or substantially attenuate. The range of frequencies passed by a filter is referred to as the "passband" of the filter. The range of frequencies stopped by such a filter is referred to as the "stopband" of the filter. A typical RF filter has at least one passband and at least one stopband. Specific requirements on a passband or stopband depend on the specific application. For example, a "passband" may be defined as a frequency range where the insertion loss of a filter is less than a defined value such as one dB, two dB, or three dB. A "stopband" may be defined as a frequency range where the insertion loss of a filter is greater than a defined value such as twenty dB, twenty-five dB, forty dB, or greater depending on application. A "multiple-passband" filter is a filter that provides multiple noncontiguous passbands separated by stopbands. For example, a dual-passband filter has two disjoint frequency ranges with low insertion loss separated by a stopband having high insertion loss.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

Surface acoustic wave (SAW) resonators are used in a variety of RF filters including band-reject filters, band-pass filters, duplexers, and multiplexers. A duplexer is a radio frequency filter device that allows simultaneous transmission in a first frequency band and reception in a second frequency band (different from the first frequency band) using a common antenna. A multiplexer is a radio frequency filter with more than two input or output ports with multiple passbands. A triplexer is a four-port multiplexer with three passbands.

RF filters typically require many design trade-offs to achieve, for each specific application, the best compromise between such performance parameters as insertion loss, rejection, isolation, power handling, linearity, size and cost. Specific design and manufacturing methods and enhancements can benefit simultaneously one or several of these requirements. With the explosive growth of wireless communication and the appearance of new frequency bands for LTE networks, the frequency spectrum has become very crowded, driving the need for duplexers and filters with steeper roll-off at the edges of the filter pass-band and low thermal drift to reduce the gap between frequency bands and to extend the efficiency of use of the available bandwidth.

DESCRIPTION OF THE DRAWINGS

FIG. 1A is a schematic plan view of a temperature compensated surface acoustic wave resonator.

FIG. 1B is a detail view of a portion of the resonator of FIG. 1A showing piston masses.

FIG. 1C is a cross-sectional view through the piston masses shown in FIG. 1B.

Figure 2:
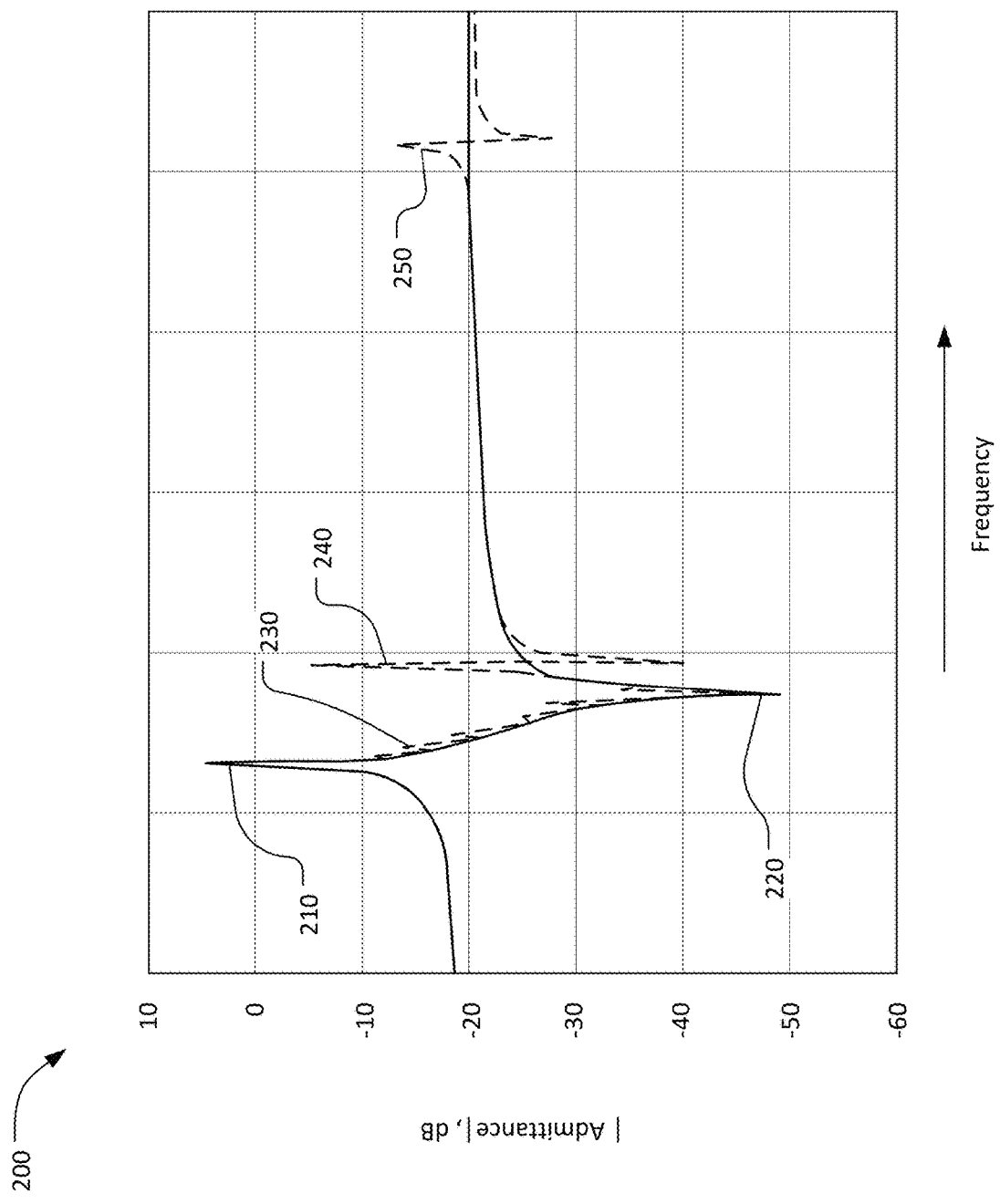
FIG. 2 is a graph of the admittance of a resonator exhibiting spurious modes.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having the same reference designator.

DETAILED DESCRIPTION

Description of Apparatus

Referring now to FIG.1A, a SAW resonator 100 includes an interdigital transducer (IDT) formed by thin film conductor patterns formed on a surface of a substrate made from a single-crystal piezoelectric material such as lithium niobate, lithium tantalate, or lanthanum gallium silicate. The conductor patterns forming the IDT include first and second bus bars 110, 120. First and second pluralities of parallel conductors, such as conductor 130, extend respectively from the first and second bus bars such that the first and second pluralities of parallel conductors are interleaved.

In particular, the SAW resonator 100 may be a temperature-compensated resonator in which the substrate is 128-degree Y-cut lithium niobate, the conductor patterns are formed from copper or a substantially copper material, and the conductor patterns are buried in an SiO$_2$ layer (160 in FIG. 1C) deposited on the substrate after the conductor patterns are formed. In this context, "substantially copper" includes pure copper, copper with naturally occurring impurities, and copper alloys where copper is the majority component. "Substantially copper" also includes copper or copper alloy layers in conjunction with thin films of other materials that may serve, for example to improve the adhesion of the conductors to the substrate and/or to passivate the copper layer.

The portion of the IDT where the parallel conductors overlap is the "aperture" 105 of the SAW resonator 100. Dimension W is the width of the aperture. The aperture 105 of the SAW resonator 100 is separated from the two bus bars by gaps 115.

A radio frequency or microwave voltage applied across an IDT generates a surface acoustic wave (SAW) that can propagate in the crystalline substrate. The coupling of the IDT to the SAW is highly frequency dependent. Grating reflectors, not shown, may be disposed on the substrate to confine most of the energy of the acoustic waves to the area of the substrate occupied by the first and second IDTs 110, 120. In general, the SAW resonator 100 is bi-directional, and either of the first and seconds IDTs may be used as the input and the other IDT as the output of the resonator.

Ideally, the signal applied across the IDT excites only a single acoustic mode, such as a Rayleigh wave, that propagates along the surface of the substrate in the left-right direction as shown in FIG. 1A. In practice, a signal applied to either IDT bus bar 110, 120 may excite a variety of acoustic modes that propagate on or within the substrate and other elements of the SAW resonator 100. Other modes that may be excited include transverse modes that propagate in the direction orthogonal to the direction of the Rayleigh wave, a shear-horizontal (SH) wave that propagates in the horizontal direction (as shown in FIG. 1A), and a bulk or Lamb (L) mode that propagates in the SiO$_2$ layer deposited over the conductor patterns.

FIG. 1B is a detail view of the parallel IDT conductors near the margin of the resonator aperture. FIG. 1C is a cross-sectional view through the section A-A defined in FIG. 1B. Dimension P is the pitch, or center-to-center distance between adjacent IDT conductors. Dimension A is the width of each IDT conductor. The ratio A/P is the fill factor of the parallel conductors. "Piston masses" 140 may be formed on the parallel conductors of the IDTs at the margins of the aperture 105 of the resonator. The piston masses 140 are typically formed of a second layer of metal (typically, but not necessarily the same metal used for the IDT conductors) formed on top of the IDT conductors. The piston masses cause a region of lower acoustic velocity at the margins of the aperture 105. By properly matching this velocity to the IDT and boundary regions, the piston masses 140 suppress transverse modes that propagate in the up/down direction as shown in FIG. 1A. The presence of the piston masses causes the resonator to operate in a "piston mode" in which the amplitude of the acoustic mode is nearly constant across the aperture of the resonator. Dimensions $A_{PST}$ and $L_{PST}$ are the width and length, respectively, of the piston masses. The edges of the piston masses 140 are nominally offset from the edges of the IDT conductor be a margin δ related to the accuracy with which successive layers can be aligned during fabrication of the resonator.

Referring to FIG. 1C, dimension DCU is the thickness of the IDT conductors 130. Dimension $D_{CU}$ is the thickness of the IDT conductors 130. Dimension $D_{OX}$ is the thickness of the SiO$_2$ layer 160. Dimension $D_{PST}$ is the thickness of the piston masses 140.

Referring now to FIG. 2, the solid line is a graph of the desired admittance of a SAW resonator, which has a Rayleigh mode with very high admittance at a resonance frequency 210 and very low admittance at an anti-resonance frequency 220. The difference between the Rayleigh mode resonance frequency 210 and anti-resonance frequency 220 is determined by a "coupling factor" that is dependent on the resonator physical characteristics and the substrate material and cut angle. A relatively high coupling factor (i.e. ≥0.08) results in relatively high difference between the resonance and the anti-resonance frequencies and is generally desired in resonators for use in microwave filters.

In FIG. 2, dashed lines illustrate the effects of coupling into other modes. Coupling acoustic energy into transverse modes causes ripples 230 in the admittance of the resonator. Coupling into the SH mode results in a second resonance and anti-resonance 240. In the example of FIG. 2, the SH mode is located at a frequency slightly higher than the frequency of the anti-resonance 220 of the Rayleigh mode. However, the frequency of the SH mode is not necessarily higher than the Rayleigh mode anti-resonance frequency 220. The SH mode frequency can be as low as the resonance frequency 210 of the Rayleigh mode. Coupling into the L mode results in a third resonance and antiresonance 250 at frequencies substantially higher than the frequency of the anti-resonance frequency 220 of the Rayleigh mode.

A combined analytical and empirical method has been used to investigate resonator designs that provide relatively high coupling factor, reduced temperature dependence compared to conventional (i.e. not temperature-compensated) resonators, and complete, or near-complete, suppression of unwanted spurious SH and transverse modes. As an initial step, a finite element simulation tool was used to analyze various resonator configurations including copper conductors buried in a thick SiO$_2$ layer on 128-degree y-rotated LiNbO3 substrates. This analysis assumed standard material properties (density, stiffness, etc.) for the substrate, conductor, and oxide layers. The results of this analysis included estimates of piston mass geometries (i.e. piston mass length, width, thickness) and material stack configurations (i.e. thicknesses of the copper conductors, piston masses, SiO$_2$ layer) that minimize spurious modes.

Test element group (TEG) wafers were designed based on the simulation results and subsequently fabricated and tested. Each TEG wafer contained test resonator structures with different combinations of dimensions (e.g. IDT conductor pitch P and fill factor A/P, aperture width W, piston mass length $L_{PST}$ and width $A_{PST}$). Multiple TEG wafers were fabricated with different material stacks (i.e. different combinations of thickness of the copper conductors $D_{CU}$, thickness of the piston masses $D_{PST}$, and thickness of the SiO$_2$ layer $D_{OX}$). The TEG wafers included resonators spanning the following parameter ranges: $0.10<D_{CU}/P<0.25$, $0.45<D_{OX}<1.0$, $0.4<A_{PST}/P<0.5$, and $0.8<L_{PST}<2.6$. All of the TEG wafers were covered with a thin passivation layer. The SiO$_2$ layer thickness $D_{OX}$ does not include the passivation layer.

The test data taken on the TEG wafers was used to adjust the assumptions (material properties, dimensions, etc.) used in the finite element analysis tool to achieve maximum correlation between analytical and experimental results. Further, the combined analytical and experimental result were used to define a multidimensional design space that bounds resonator designs to be used in filters, as follows:

$$0.12P \leq Dcu \leq 0.24P \quad (1)$$

$$0.45P \leq Dox \leq 0.80P \quad (2)$$

$$3.1 \leq Dox/Dcu \leq 4.5 \quad (3)$$

$$0.1Dcu \leq D_{PST} \leq 0.5Dcu \quad (4)$$

$$0.5A \leq A_{PST} \leq A \quad (5)$$

$$P \leq L_{PST} \leq 2P \quad (6)$$

Figure 3:
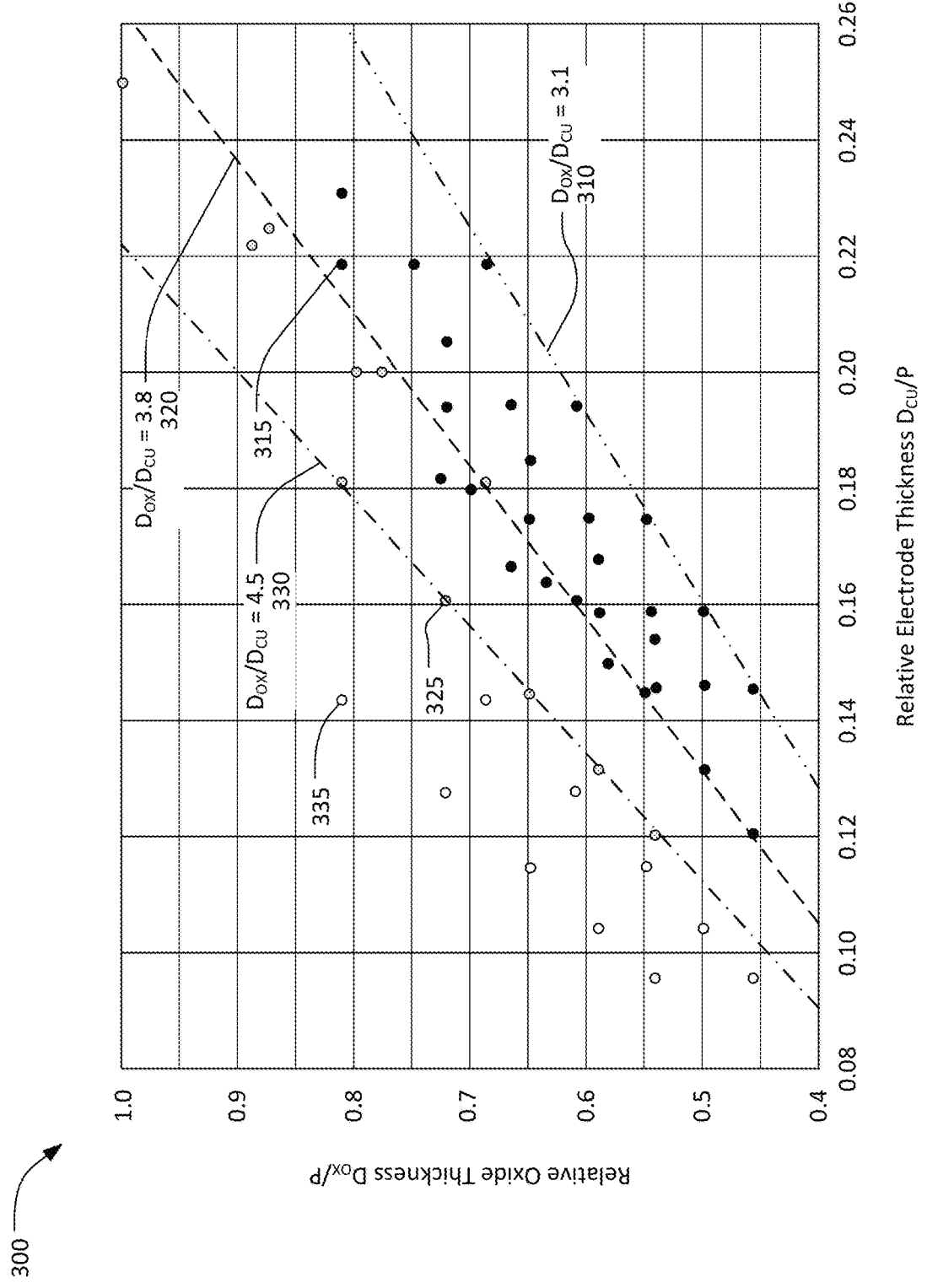
FIG. 3 is a graph showing resonator performance as a function of conductor thickness and oxide thickness.

FIG. 3 is a chart 300 of measured performance of example resonators from TEG wafers. Resonator performance is plotted as a function of relative IDT conductor thickness $D_{CU}$ and relative $SiO_2$ overcoat thickness $D_{OX}$. Both DCU and DOX are defined relative to the IDT conductor pitch P. Each circle represents a particular resonator configuration. Black circles, such as black circle 315, represent resonator configuration where coupling to the SH mode is considered (according to a first predetermined criteria) to be highly suppressed Open circles, such as open circle 335, are resonator configurations with substantial (according to a second predetermined criteria) coupling to the SH mode. Gray circles, such as gray circle 330, represent resonator configurations with increased coupling (relative to the resonators represented by black circles) to the SH mode but useful at least some filter applications. Useful performance can be obtained with IDT conductor thickness from 0.12P to at least 0.24P so long as the ratio $Dox/D_{CU}$ is less than or equal to 4.5 (as indicated by the broken line 330). The SH mode may be considered negligible if the ratio $Dox/D_{CU}$ is less than about 3.8 (as indicated by the dashed line 320). For these resonator configurations, the ratio $Dox/D_{CU}$ is greater than or equal to 3.1 (as indicated by the broken line 310). $Dox/D_{CU}$ is greater than or equal to 3.1 is a practical limit to avoid unnecessarily thick IDT conductors.

Figure 4:
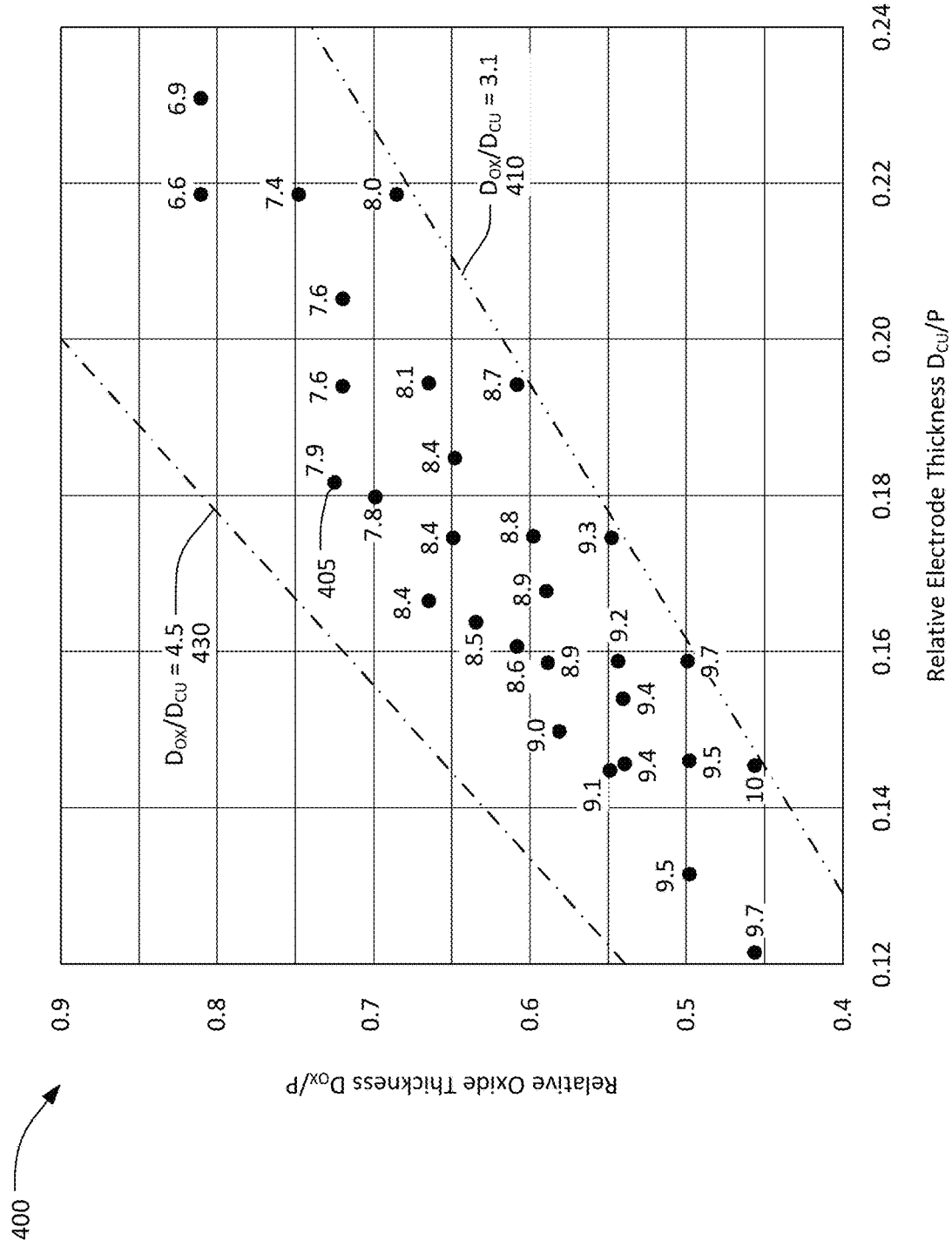
FIG. 4 is a graph of resonator coupling factor as a function of conductor thickness and oxide thickness.

FIG. 4 is a chart 400 of measured resonator coupling factor as a function of relative IDT conductor thickness $D_{CU}$ and relative $SiO_2$ overcoat thickness $D_{OX}$. Each circle, such as circle 405, represents one of the resonator configurations from FIG. 3. The number adjacent to each circle is the coupling factor in percent. For these resonator configurations, a coupling factor greater than 8% (0.08) can be achieved for relative conductor widths from 0.12P to at least 0.22P and relative oxide thickness less than or equal to 0.7P. A coupling factor greater than 7% (0.07) can be achieved for relative oxide thickness less than or equal to 0.8P. The boundaries of the resonator design space are indicated by the broken lines 410 and 430.

Figure 5:
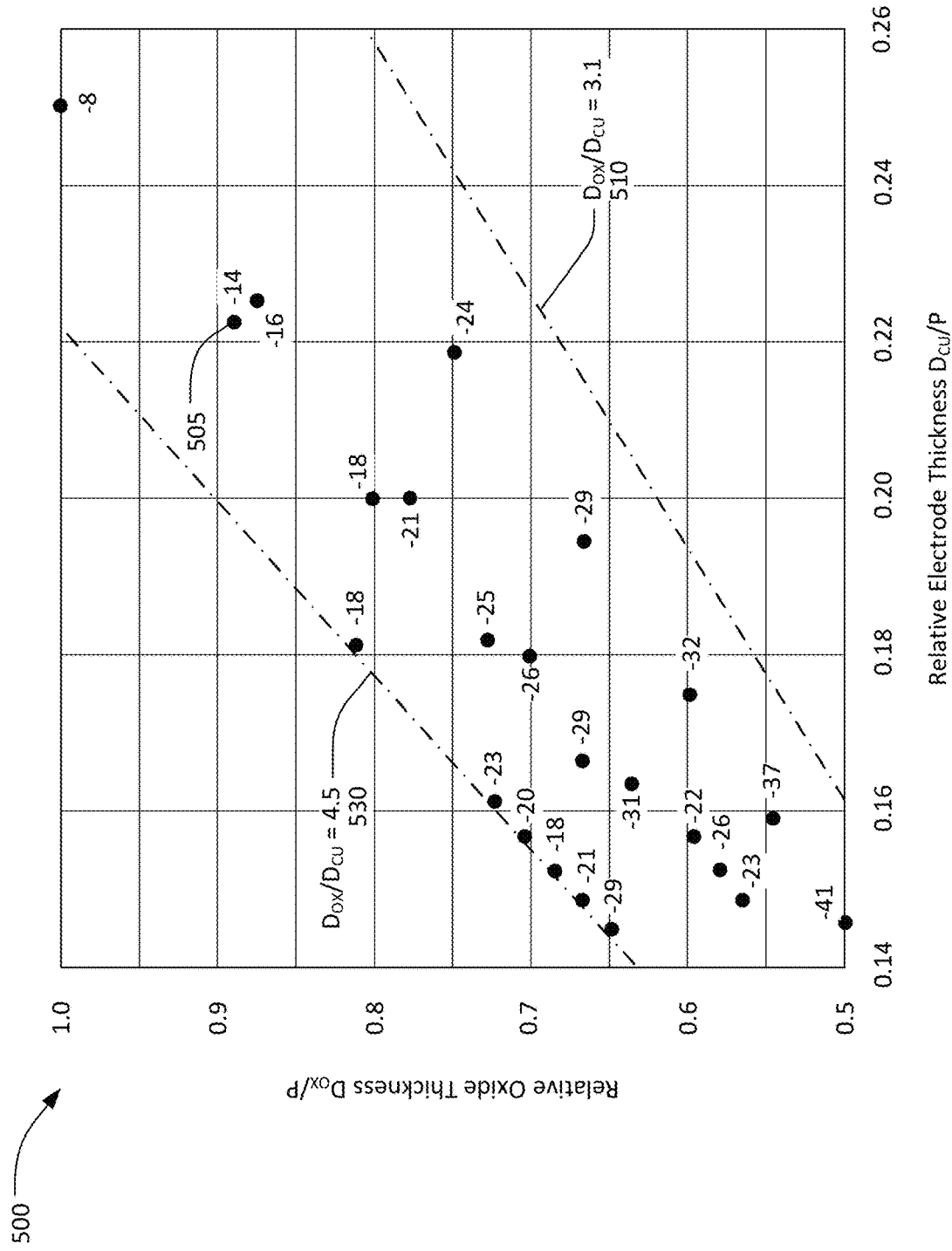
FIG. 5 is a graph of resonator temperature coefficient as a function of conductor thickness and oxide thickness.

FIG. 5 is a chart 500 of resonator temperature sensitivity as a function of relative IDT conductor thickness $D_{CU}$ and relative $SiO_2$ overcoat thickness $D_{OX}$. Each circle, such as circle 505, represents a different resonator configuration. The number adjacent to each circle is the temperature coefficient of the resonance frequency of the Rayleigh mode in parts per million (PPM) per degree Celsius. Comparison of FIG. 5 and FIG. 4 shows that a resonator configuration with a relative conductor thickness of 0.15P can have temperature coefficient between −20 ppm/degree C. and −25 ppm/degree C. with greater than 0.09 (9%) coupling factor. A resonator configuration with a relative conductor thickness of 0.22P provides a temperature coefficient of about −15 ppm/degree C. and greater than 0.075 (7.5%) coupling factor. It is believed that these combinations of temperature coefficient and coupling factor represent a significant improvement over the performance of previously-reported resonators with conductor thickness less than 0.15P. The boundaries of the resonator design space are indicated by the broken lines 510 and 530.

The analysis and experimental results indicate the required length $L_{PST}$ (i.e. the length necessary to suppress transverse modes) of piston masses scales approximately with the IDT pitch P and inversely with piston layer thickness $D_{PST}$. The piston length $L_{PST}$ does not scale linearly with P for fixed piston mass thickness, since the acoustic thickness (relative to P) reduces with the increase of P. It is to be noted that thicker piston layers demonstrate weaker dependence on their length than their thinner counterpart. Excessive piston mass length relative to the piston mass thickness can result is splitting of the Rayleigh mode resonance peak.

Figure 6A:
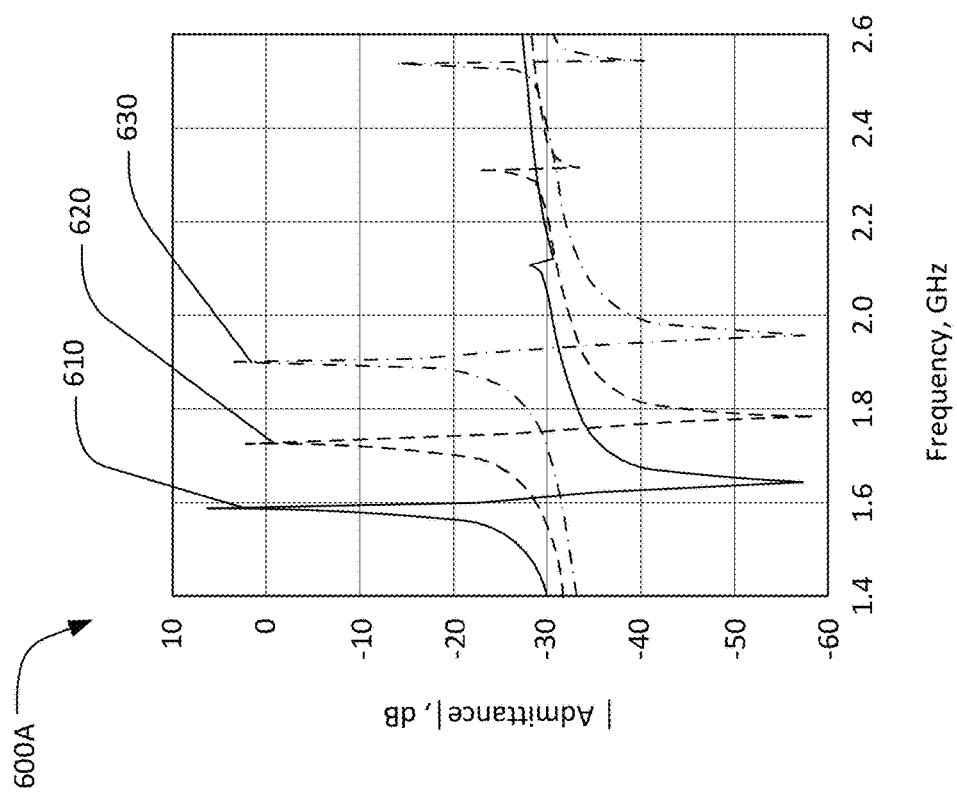
FIG. 6A, FIG. 6B, and FIG. 6C are each graphs of the admittances of exemplary resonators having different piston mass configurations and/or oxide overcoat thickness.
Figure 6B:
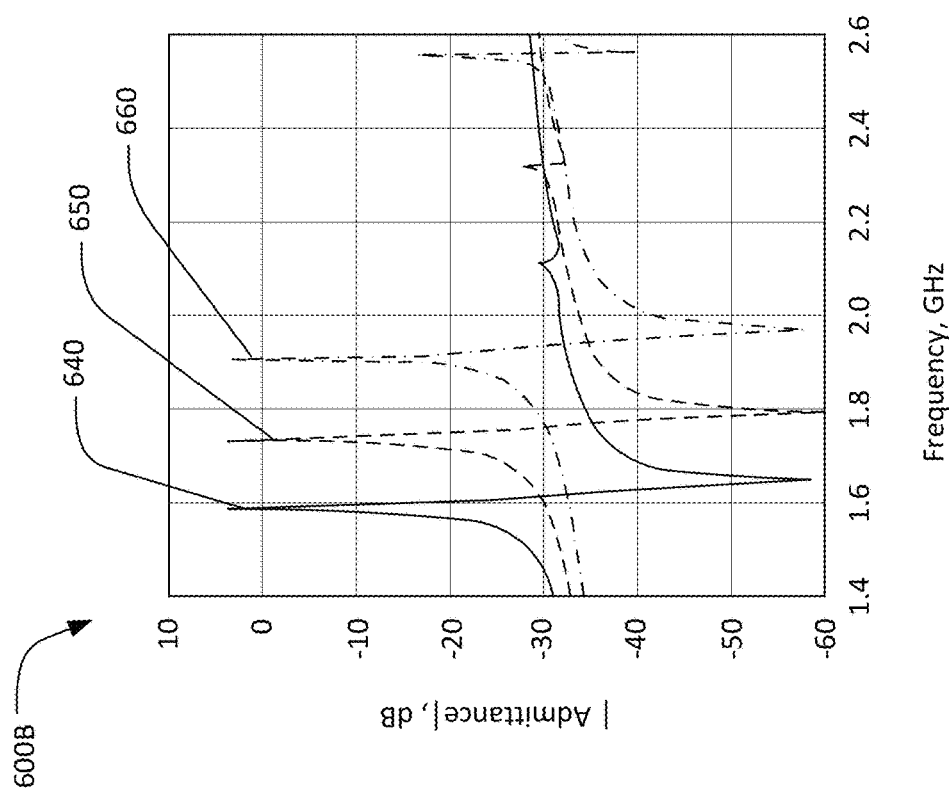
Figure 6C:
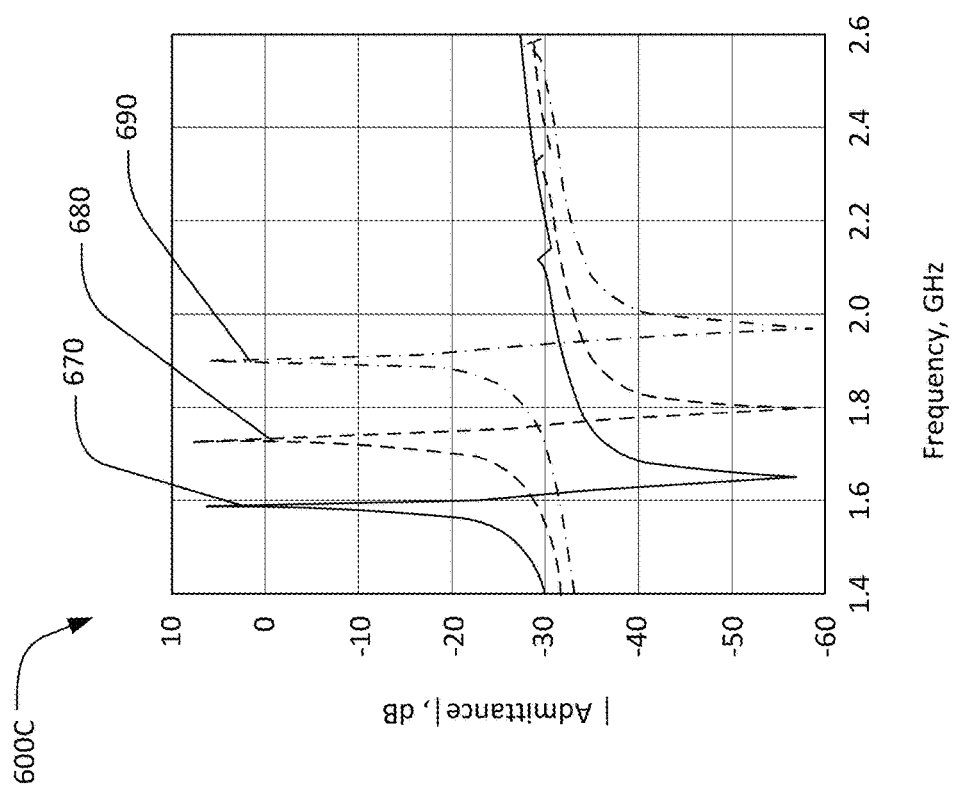

The configurations in FIG. 6A, FIG. 6B, and FIG. 6C are each graphs 600A, 600B, 600C respectively, of the measured admittances of three exemplary resonator configurations having different piston mass configurations and/or oxide overcoat thickness. The key dimensions of each resonator configuration are listed adjacent to each graph. In all cases, transverse modes and the SH mode are suppressed. An L mode may be present at a frequency about 35% above the Rayleigh mode anti-resonance.

Figure 7:
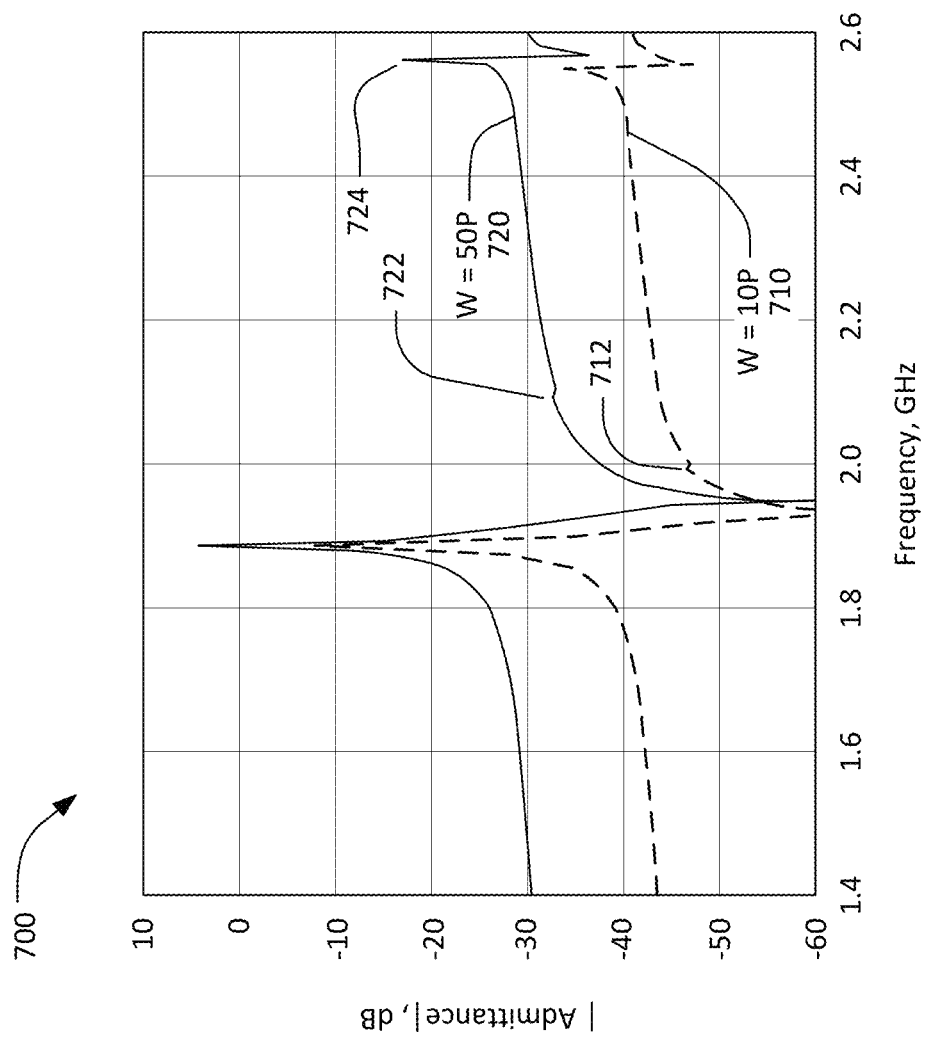
FIG. 7 is a graph of the admittance of exemplary resonators with two different aperture widths.

FIG. 7 shows a chart 700 comparing the measured admittance of two resonators with substantially different apertures and the same piston mass structure. The solid line 720 is the admittance of a resonator with an aperture W=50P. The dashed line 710 is the admittance of a resonator with an aperture W=10P. Transversal spurious SAW modes are sufficiently suppressed in both devices. A small SH-SAW is evident at 712 and 722 and is relatively stronger for the device with the smaller aperture. A relatively strong plate-guided (Lamb wave) mode 724 in the $SiO_2$ is also present at about 2.55 GHz for both devices. Further, a slight reduction in TC-SAW effective coupling (indicated by the frequency downshift of the antiresonance) of the device with the smaller aperture) is observed. The results of the transverse mode suppression are in very good agreement with the modeled predictions confirming the relative independence of the piston mode structure from the device aperture.

SAW filter devices for use in communications systems typically include multiple SAW resonators with multiple resonant frequencies and thus different IDT conductor pitch or center-to center spacing. In a filter, IDT conductor pitch may range from $P_{MIN}$ to $P_{MAX}$, where $P_{MIN}$ conductor pitch of the resonator having the highest resonance frequency and $P_{MAX}$ is the conductor pitch of the resonator with the lowest resonance frequency. Superior filter performance can be obtained if the relative conductor thickness $D_{CU}/P$ is greater than 0.12 for all resonators and greater than 0.15 for at least some of the resonators. In this case, the previous-defined design rules may be modified as follows:

$$0.12P_{MAX} \leq Dcu \leq 0.24P_{MIN} \quad (7)$$

$$0.15P_{MIN} \leq Dcu \leq 0.24P_{MIN} \quad (8)$$

$$0.45P_{MAX} \leq Dox \leq 0.80P_{MIN} \quad (9)$$

Figure 8:
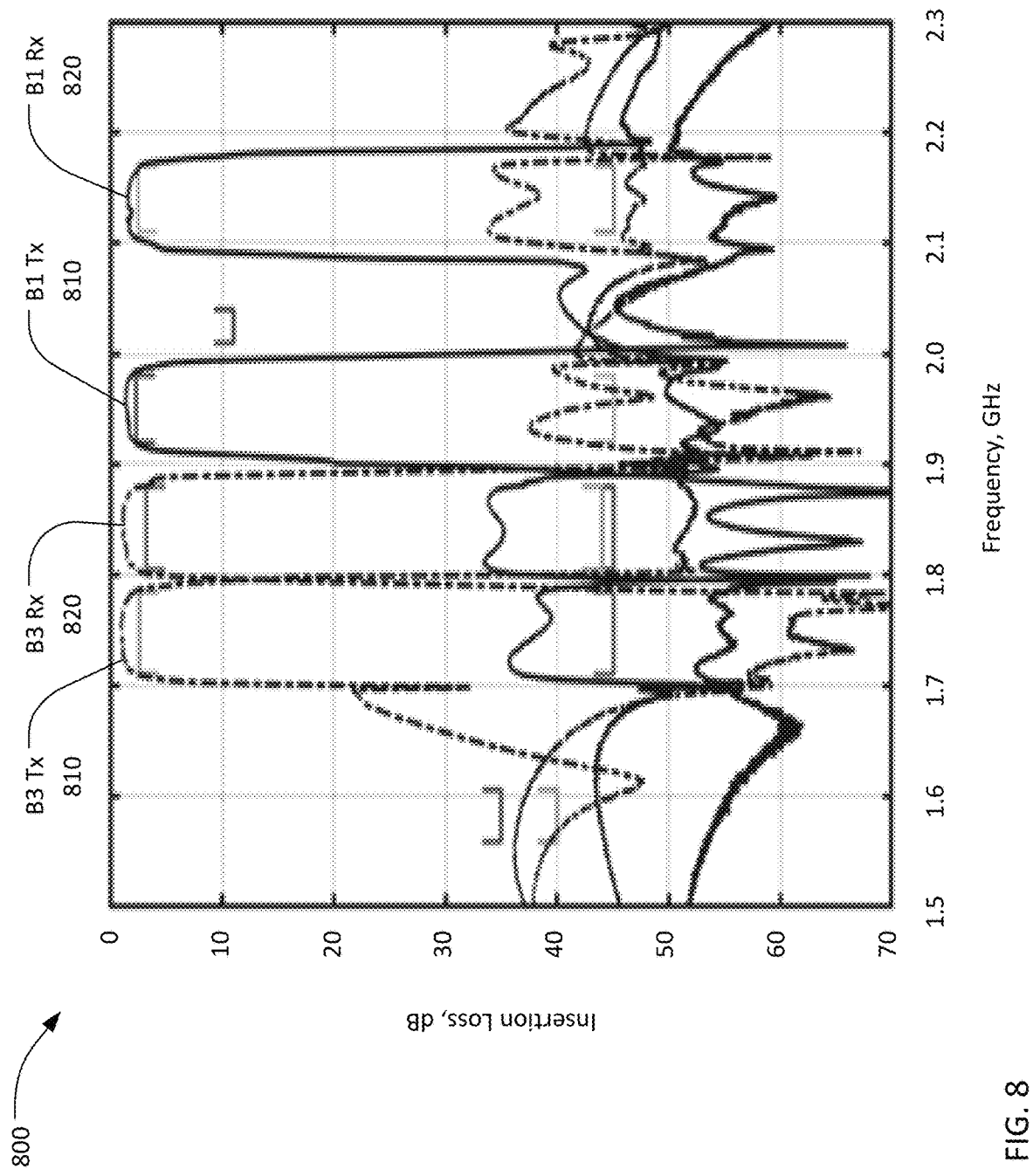
FIG. 8 is a graph of insertion loss versus frequency for a Band 1/Band 3 quadplexer using temperature compensated SAW resonators.

FIG. 8 shows a graph 800 of the insertion loss of a band 1/band 3 quadplexer designed in accordance with the previously-described multidimensional design space. Specifically, the graph 800 shows the insertion of each of four filters comprising the quadplexer. Each of the four filters includes multiple SAW resonators. Broken line 810 is plot of the insertion loss of a band 3 transmit filter. Broken line 820 is plot of the insertion loss of a band 3 receive filter. Solid line 830 is plot of the insertion loss of a band 1 transmit filter. Solid line 840 is plot of the insertion loss of a band 1 receive filter. All four filters have less than 3 dB insertion loss within their respective passbands and do not exhibit ripple or other artifacts in their passbands indicative of coupling into spurious modes within the passbands.

Each of the four filters includes multiple SAW resonators falling within the previously-described multidimensional design space. The IDT pitch of the resonators in the quadplexer range from about 0.8 micron to 1.04 microns. The conductor thickness DCU is 145 nm and the $SiO_2$ thickness $D_{OX}$ is 650 nm. The ratio $D_{OX}/D_{CU}$ is 4.5. The relative conductor thickness $D_{CU}/P$ ranges from 0.14 for the lowest frequency (i.e. longest pitch) resonators to 0.18 for the highest frequency (i.e. shortest pitch) resonators. The relative $SiO_2$ thickness $D_{OX}/P$ ranges from 0.625 to 0.81. The piston mass configurations fall within the previously defined boundaries.

Description of Processes

Figure 9:
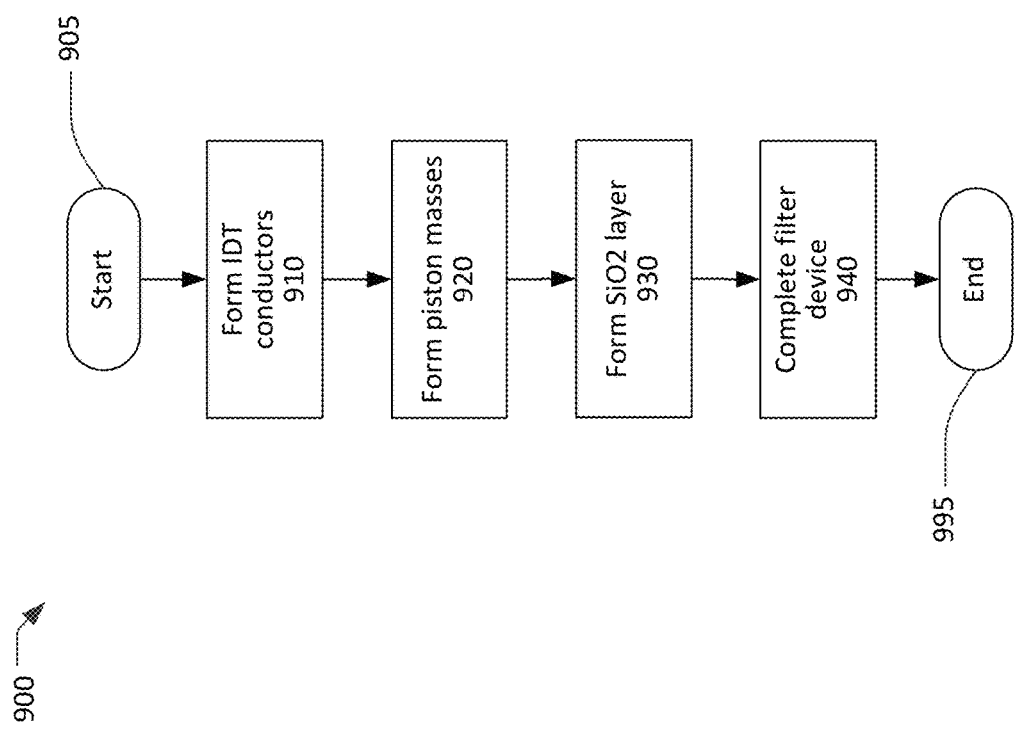
FIG. 9 is a flow chart of a process for making a temperature-compensated SAW resonator.

FIG. 9 is a simplified flow chart of a method 900 for making a temperature compensated SAW filter device. The filter device may be a single resonator or a complex filter such as the quadplexer whose performance was shown in FIG. 8. The method 900 starts at 905 with a blank piezoelectric wafer and ends at 995 with a completed filter device. The substrate may be, for example, Y cut lithium niobate with a cut angle of 128 degrees. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

The IDT conductors are formed at 910 by depositing and patterning one or more layers of conductive materials including a substantially copper layer. Optionally, one or more layers of other materials may be disposed under (i.e. between the copper layer and the substrate) and/or over of the copper layer to improve the adhesion between the copper layer and/or to encapsulate the copper layer. These layers may be deposited using any suitable thin film deposition process such as evaporation or sputtering.

The IDT conductors may be patterned at 910 using a subtractive patterning process. A copper layer and, optionally, one or more other conductive layers may be deposited in sequence over the surface of the substrate. The excess metal may then be removed (i.e. subtracted) by etching through patterned photoresist. The copper layer can be etched, for example, by plasma etching, reactive ion etching, wet chemical etching, and other etching techniques. Other conductive layers, if present, can be etched using known processes for those materials.

Alternatively, the IDT conductors may be patterned at 910 using an additive or "lift-off" patterning process. Photoresist may be deposited over the substrate and patterned to define the IDT conductor locations. A copper layer and, optionally, one or more other conductive layers may be deposited in sequence. The photoresist may then be removed, which removes the excess conductive materials, leaving the patterned IDT conductors.

With either an additive or subtractive patterning process, the relative thickness $D_{CU}/P$ of the IDT conductors (the copper layer plus any adjacent conductive layers) may be between 0.12 and 0.24. In a filter device having multiple resonators, the relative thickness of the IDT conductors may be 0.12 and 0.24 for all of the resonators and greater than 0.15 for at least some of the resonators.

At 920, piston masses may be formed on top of the IDT conductors at the margins of the aperture of each resonator. The piston masses may the same material at the IDT conductors or a different material having density substantially higher than the density of the SiO2 layer to be subsequently deposited over the piston masses and IDT conductors. When the piston masses are substantially copper, they may be deposited and patterned as previously described. When the piston masses are some other material, they may be deposited and patterned using appropriate processes for that material.

At 930, an SiO2 layer may be deposited over the piston masses and IDT conductors. The SiO2 may be deposited by sputtering, chemical vapor deposition, or some other process. After deposition, the surface of the SiO2 layer may be planarized using, for example, chemical-mechanical planarization. The final relative thickness of the SiO2 $D_{OX}$ (measured from the surface of the substrate to the surface of the SiO2 layer) should be with in the limits given by equations (2), (3), and (9).

After the $SiO_2$ layer is formed at 930, the filter device may be completed at 940. Actions that may occur at 940 include depositing and patterning additional metal layers to form conductors other than the IDT conductors; depositing an encapsulation/passivation layer over all or a portion of the device; forming bonding pads or solder bumps or other means for making connection between the device and external circuitry; excising individual device die from a wafer containing multiple die; other packaging steps; and testing. After the filter device is completed, the process ends at 995.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A surface acoustic wave (SAW) resonator comprising:
a 128-degree Y-cut lithium niobate substrate;

an interdigital transducer (IDT) formed on a surface of the substrate, the IDT comprising:
  a first bus bar and a first plurality of parallel conductors extending from the first bus bar;
  a second bus bar and a second plurality of parallel conductors extending from the second bus bar, the second plurality of parallel conductors interleaved with the first plurality of parallel conductors; and
an SiO2 layer overlaying the first and second pluralities of parallel conductors, wherein
the first and second pluralities of parallel conductors are substantially copper and have a thickness $D_{CU}$ defined by $0.161 \leq D_{CU} \leq 0.24P$, where P is a center-to-center spacing of adjacent parallel conductors; and
the SiO2 layer has a thickness $D_{OX}$ defined by $3.1D_{CU} \leq D_{OX} \leq 4.5D_{CU}$.

2. The SAW resonator of claim 1, wherein
each of the first and second pluralities of parallel conductors has a length normal to the respective bus bar of W+G, where W is an aperture width of the SAW resonator and G is a gap distance,
an end of each of the first plurality of parallel conductors is separated from the second bus bar by the gap distance G, and
an end of each of the second plurality of parallel conductors is separated from the first bus bar by the gap distance G.

3. The SAW resonator of claim 2, further comprising:
piston masses formed on the first and second pluralities of parallel conductors at the margins of the aperture width W, wherein the SiO2 layer also overlays the piston masses.

4. The SAW resonator of claim 3, wherein the piston masses are configured to suppress transverse modes.

5. The SAW resonator of claim 3 wherein each piston mass has a thickness $D_{PST}$ and a length $L_{PST}$ defined by $0.1Dcu \leq D_{PST} \leq 0.5Dcu$ and $P \leq L_{PST} \leq 2P$.

6. The SAW resonator of claim 3, wherein
each of the first and second pluralities of parallel conductors has a width A normal to its length, and
each of the piston masses has a width $A_{PST}$ defined by $0.5A \leq A_{PST} \leq A$.

7. A surface acoustic wave (SAW) filter comprising:
a 128-degree Y-cut lithium niobate substrate;
two or more conductor patterns for a corresponding number of SAW resonators formed on a surface of the substrate, each conductor pattern comprising:
  a first plurality of parallel conductors extending from a first bus bar; and
  a second plurality of parallel conductors extending from a second bus bar, the second plurality of parallel conductors interleaved with the first plurality of parallel conductors,
  each of the two or more conductor patterns having a respective center-to-center distance between adjacent parallel conductors,
  wherein $P_{MAX}$ is a maximum center-to-center spacing of adjacent parallel conductors among the two or more conductor patterns and $P_{MIN}$ is a minimum center-to-center spacing of adjacent parallel conductors from the two or more conductor patterns; and
an SiO2 layer overlaying the two or more conductor patterns, wherein
the first and second pluralities of parallel conductors are substantially copper and have a thickness $D_{CU}$ defined by $0.12P_{MAX} < D_{CU} < 0.24P_{MIN}$ and $0.15P_{MIN} < D_{CU}$, and
the SiO2 layer has a thickness $D_{OX}$ defined by $3.1D_{CU} \leq D_{OX} \leq 4.5D_{CU}$.

8. The SAW filter of claim 7, wherein, for each of the two or more conductor patterns,
each of the first and second pluralities of parallel conductors has a length normal to the respective bus bar of W+G, where W is an aperture width of the SAW resonator and G is a gap distance,
an end of each of the first plurality of parallel conductors is separated from the second bus bar by the gap distance G, and
an end of each of the second plurality of parallel conductors is separated from the first bus bar by the gap distance G.

9. The SAW filter of claim 8, further comprising, for each of the two or more conductor patterns:
piston masses formed on the first and second pluralities of parallel conductors at the margins of the aperture width W, wherein the SiO2 layer also overlays the piston masses.

10. The SAW filter of claim 9, wherein the piston masses are configured to suppress transverse modes.

11. The SAW filter of claim 9 wherein, for each of the two or more SAW conductor patterns, each piston mass has a thickness $D_{PST}$ and a length $L_{PST}$ defined by $0.1Dcu \leq D_{PST} \leq 0.5D_{cu}$ and $P \leq L_{PST} \leq 2P$, where P is the center-to-center spacing of adjacent parallel conductors.

12. The SAW filter of claim 9, wherein, for each of the two or more conductor patterns,
each of the first and second pluralities of parallel conductors has a width A normal to its length, and
each of the piston masses has a width $A_{PST}$ defined by $0.5A \leq A_{PST} \leq A$.

13. A method of fabricating a acoustic wave (SAW) filter device comprising:
forming two or more conductor patterns for a corresponding number of SAW resonators on a surface of a 128-degree Y-cut lithium niobate substrate, each conductor pattern comprising:
  a first plurality of parallel conductors extending from a first bus bar; and
  a second plurality of parallel conductors extending from a second bus bar, the second plurality of parallel conductors interleaved with the first plurality of parallel conductors,
  each of the two or more conductor patterns having a respective center-to-center distance between adjacent parallel conductors,
  wherein $P_{MAX}$ is a maximum center-to-center spacing of adjacent parallel conductors among the two or more conductor patterns and $P_{MIN}$ is a minimum center-to-center spacing of adjacent parallel conductors from the two or more conductor patterns; and
forming an SiO2 layer overlaying the two or more conductor patterns, wherein
the first and second pluralities of parallel conductors are substantially copper and have a thickness $D_{CU}$ defined by $0.12P_{MAX} < D_{CU} < 0.24P_{MIN}$ and $0.15P_{MIN} < D_{CU}$, and
the SiO2 layer has a thickness $D_{OX}$ defined by $3.1D_{CU} \leq D_{OX} \leq 4.5D_{CU}$.

14. The method of claim 13, wherein, for each of the two or more conductor patterns,
each of the first and second pluralities of parallel conductors has a length normal to the respective bus bar of W+G, where W is an aperture width of the SAW resonator and G is a gap distance, an end of each of the first plurality of parallel conductors is separated from the second bus bar by the gap distance G, and an end of each of the second plurality of parallel conductors is separated from the first bus bar by the gap distance G.

15. The method of claim 14, further comprising: for each of the two or more conductor patterns:

forming piston masses on the first and second pluralities of parallel conductors of the two or more conductor patterns at the margins of the respective aperture width W, wherein the SiO2 layer also overlays the piston masses.

16. The method of claim 15, wherein the piston masses are configured to suppress transverse modes.

17. The method of claim 15, wherein, for each of the two or more SAW conductor patterns, each piston mass has a thickness $D_{PST}$ and a length $L_{PST}$ defined by $0.1 D_{CU} \leq D_{PST} \leq 0.5 D_{CU}$ and $P \leq L_{PST} \leq 2P$, where P is the center-to-center spacing of adjacent parallel conductors.

18. The method of claim 15, wherein, for each of the two or more conductor patterns, each of the first and second pluralities of parallel conductors has a width A normal to its length, and each of the piston masses has a width $A_{PST}$ defined by $0.5A \leq A_{PST} \leq A$.

* * * * *